(12) United States Patent
Chen et al.

(10) Patent No.: US 7,973,646 B2
(45) Date of Patent: Jul. 5, 2011

(54) METHOD AND APPARATUS FOR INSPECTING RADIO FREQUENCY IDENTIFICATION TAGS

(75) Inventors: Hui-Ta Chen, Taichung (TW); Guo-Shing Huang, Tainan (TW); Ching-Chih Lin, Kaohsiung (TW); Chun-Hao Chang, Kaohsiung County (TW); Chuan-Sheng Zhuang, Taichung County (TW); Ming-Hsien Ko, Chiayi County (TW); Chih-Hung Kao, Changhua County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 893 days.

(21) Appl. No.: 11/944,596

(22) Filed: Nov. 23, 2007

(65) Prior Publication Data

US 2008/0174407 A1    Jul. 24, 2008

(30) Foreign Application Priority Data

Jan. 24, 2007    (TW) ................................ 96102602 A

(51) Int. Cl.
*H04Q 5/22* (2006.01)
(52) U.S. Cl. .................... 340/10.4; 340/10.1; 340/572.1; 340/572.4; 340/572.7
(58) Field of Classification Search ................. 340/10.1, 340/572.1, 572.7
See application file for complete search history.

(56) References Cited

U.S. PATENT DOCUMENTS

| 3,951,904 | A | * | 4/1976 | Tomonaga | 523/137 |
|---|---|---|---|---|---|
| 4,811,667 | A | * | 3/1989 | Morishita et al. | 104/284 |
| 4,811,685 | A | * | 3/1989 | Murai | 118/326 |
| 4,919,054 | A | * | 4/1990 | Matsuo | 104/94 |
| 4,980,219 | A | * | 12/1990 | Hiraide et al. | 428/134 |
| 5,770,304 | A | * | 6/1998 | Nakamura et al. | 428/328 |
| 6,104,291 | A | * | 8/2000 | Beauvillier et al. | 340/572.1 |
| 6,502,783 | B1 | * | 1/2003 | Smith et al. | 242/530.3 |
| 6,765,852 | B1 | * | 7/2004 | Van Den Enden et al. | 369/53.21 |
| 6,806,842 | B2 | * | 10/2004 | King et al. | 343/795 |
| 6,820,093 | B2 | * | 11/2004 | de la Huerga | 707/687 |
| 6,972,394 | B2 | * | 12/2005 | Brod et al. | 219/121.85 |
| 7,089,935 | B1 | * | 8/2006 | Rand | 128/203.15 |
| 7,158,036 | B2 | * | 1/2007 | Tada | 340/572.4 |
| 7,425,896 | B2 | * | 9/2008 | Kawamata | 340/572.1 |
| 7,464,366 | B2 | * | 12/2008 | Shukla et al. | 717/100 |
| 7,528,712 | B2 | * | 5/2009 | Hong et al. | 340/514 |

(Continued)

FOREIGN PATENT DOCUMENTS

CN    2614842 Y    5/2004

(Continued)

*Primary Examiner* — George A Bugg
*Assistant Examiner* — Paul Obiniyi
(74) *Attorney, Agent, or Firm* — WPAT, PC; Justin King

(57) ABSTRACT

A method and an apparatus for inspecting radio frequency identification (RFID) tags which utilize a way of shielding for inspecting whether RFID tags function properly or not. The method of the present invention comprises steps of: reading a plurality of RFID tags in a readable zone; and determining whether there is any malfunctional RFID tag in the plurality of RFID tags. If all the plurality of RFID tags function properly, the method will check a next plurality of RFID tags. If there is at least one unreadable RFID tag, the at least one malfunctional RFID tag will be found by shielding one or the plurality of RFID tags. By means of the disclosure in the present invention, the present method and apparatus are capable of improving the efficiency during inspection and simplifying the design of a readable zone.

16 Claims, 21 Drawing Sheets

U.S. PATENT DOCUMENTS

| | | | |
|---|---|---|---|
| 2002/0122911 A1* | 9/2002 | Downs | 428/42.3 |
| 2004/0095157 A1* | 5/2004 | Sato et al. | 324/754 |
| 2005/0041539 A1* | 2/2005 | Van Den Enden et al. | 369/30.3 |
| 2006/0006885 A1* | 1/2006 | Helmut Bode et al. | 324/750 |
| 2006/0145710 A1* | 7/2006 | Puleston et al. | 324/750 |
| 2006/0181420 A1* | 8/2006 | Ishii | 340/572.1 |
| 2006/0213805 A1* | 9/2006 | Thomas et al. | 206/714 |
| 2006/0220858 A1* | 10/2006 | Kawamata | 340/572.1 |
| 2007/0057795 A1* | 3/2007 | Kawai et al. | 340/572.7 |
| 2007/0284759 A1* | 12/2007 | Suguro et al. | 257/783 |
| 2008/0024301 A1* | 1/2008 | Fritchie et al. | 340/572.1 |

FOREIGN PATENT DOCUMENTS

| | | | |
|---|---|---|---|
| CN | 1841413 A | | 10/2006 |
| JP | 2004-220141 | | 8/2004 |
| JP | 2006-277233 | | 10/2006 |
| JP | 2006277233 A | * | 10/2006 |
| TW | 330297 | | 4/1998 |

* cited by examiner

METHOD AND APPARATUS FOR INSPECTING RADIO FREQUENCY IDENTIFICATION TAGS

BACKGROUND OF THE INVENTION

1. Field of the Invention

The present invention generally relates to an inspecting method and apparatus and, more particularly, to a method and an apparatus for inspecting radio frequency identification (RFID) tags by determining whether there is any malfunctional RFID tag and then determining where the malfunctional RFID tag is located using a way of shielding.

2. Description of the Prior Art

Since 2004, the radio frequency identification (RFID) technology has become one of the top 10 breakthrough technologies of the century. The RFID technology has been widely used in, for example, logistics, inventory management, national securities, medical science and public health.

The RFID technology using a reader, RFID tags and middleware and system integration is characterized in that the reader issues radio waves at a specific frequency to the RFID tags to drive the circuitry in the RFID tags to transmit the data in the chip back to the reader.

An RFID tag comprises an RF integrated circuit (RFIC) and an antenna. An RFID tag is packaged using an an-isotropic conductive paste (ACP) to agglutinate the substrate of the antenna so that the conductive particles in the an-isotropic conductive paste complete the electric circuit. The packaging quality depends on the packaging temperature, the packaging pressure and the packaging time. Therefore, automatized detection after packaging is crucial in quality control and yield improvement when mass production is concerned.

Please refer to FIG. 1A and FIG. 1B, which are two examples of conventional apparatuses for inspecting RFID tags. In FIG. 1A, the apparatus 1a comprises a carriertape transportation device 10, a reading device 11 and a moving device 12. The carriertape transportation device 10 transports a carriertape 101 carrying a plurality of RFID tags 1011. The reading device 11 is disposed on one side of the carriertape 101. The reading device 11 comprises a reader 111 covered by a shelter 110 having an opening allowing the reader to read the data in a single RFID tag at a time. The moving device 12 is connected to the reading device 11 so as to drive the reading device 11 to move. In the apparatus 1a in FIG. 1A, the reading device 11 is moved so as to inspect an RFID tag at a time to determine whether there is any malfunctional RFID tag 1012. Even though the apparatus 1a is capable of inspecting every RFID tag, the reading device 11 has problems because of its large size, difficulty in carrying, difficulty in designing the readable zone and time-consuming inspection.

In FIG. 1B, the apparatus 1b also comprises a carriertape transportation device 10 and a reading device 13 that are similar to those of the apparatus 1a in FIG. 1A. However, reading device 13 of the apparatus 1b is not movable. Instead, the carriertape transportation device 10 sequentially moves so that the reading device 13 inspects an RFID tag at a time to determine whether there is any malfunctional RFID tag 1012, as disclosed in U.S. Pat. No. 6,104,291. Even though the apparatus 1b is capable of inspecting every RFID tag, there are problems because it is difficult to design the readable zone and time-consuming in inspection.

Therefore, there is need in providing a method and an apparatus for inspecting radio frequency identification (RFID) tags to overcome the afore-mentioned problems.

SUMMARY OF THE INVENTION

It is one object of the present invention to provide a method for inspecting radio frequency identification (RFID) tags by determining whether there is any malfunctional RFID tag and then determining where the malfunctional RFID tag is located using a way of shielding.

It is another object of the present invention to provide an apparatus for inspecting radio frequency identification (RFID) tags, using a reading device to read data in a plurality of RFID tags in a readable zone and using a sheltering device to (progressively) shielding a next one and the previously shielded one(s) of the RFID tags so as to find any malfunctional RFID tag.

In order to achieve the foregoing objects, the present invention provides a method for inspecting radio frequency identification (RFID) tags, comprising steps of: (a) reading a plurality of RFID tags in a readable zone; and (b) determining whether there is any malfunctional RFID tag in the plurality of RFID tags, and determining where the malfunctional RFID tag is located using a way of shielding if there is any malfunctional RFID tag.

In order to achieve the foregoing objects, the present invention provides an apparatus for inspecting radio frequency identification (RFID) tags, comprising: a carriertape transportation device, capable of carrying a carriertape carrying a plurality of RFID tags; a reading device, disposed on one side of the carriertape and capable of reading data in the RFID tags on the carriertape in a readable zone; a shelter, capable of shielding to limit the number of the RFID tags to be read by the reading device; and a moving device, connected to the shelter and capable of moving the shelter.

In order to achieve the foregoing objects, the present invention provides an apparatus for inspecting radio frequency identification (RFID) tags, comprising: a carriertape transportation device, capable of carrying a carriertape carrying a plurality of RFID tags; a reading device, disposed on one side of the carriertape and capable of reading data in the RFID tags on the carriertape in a readable zone; and a sheltering device, capable of shielding to limit the number of the RFID tags to be read by the reading device and capable of varying a shielding area to determine the number of RFID tags.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention providing a method and an apparatus for inspecting radio frequency identification (RFID) tags can be exemplified by the preferred embodiments as described hereinafter.

The method for inspecting radio frequency identification (RFID) tags according to the present invention comprises two steps. First, a plurality of RFID tags are read in a readable zone. Then, whether there is any malfunctional RFID tag in the plurality of RFID tags is determined. A way of shielding is used to determine where the malfunctional RFID tag is located if there is any malfunctional RFID tag.

Figure 2:
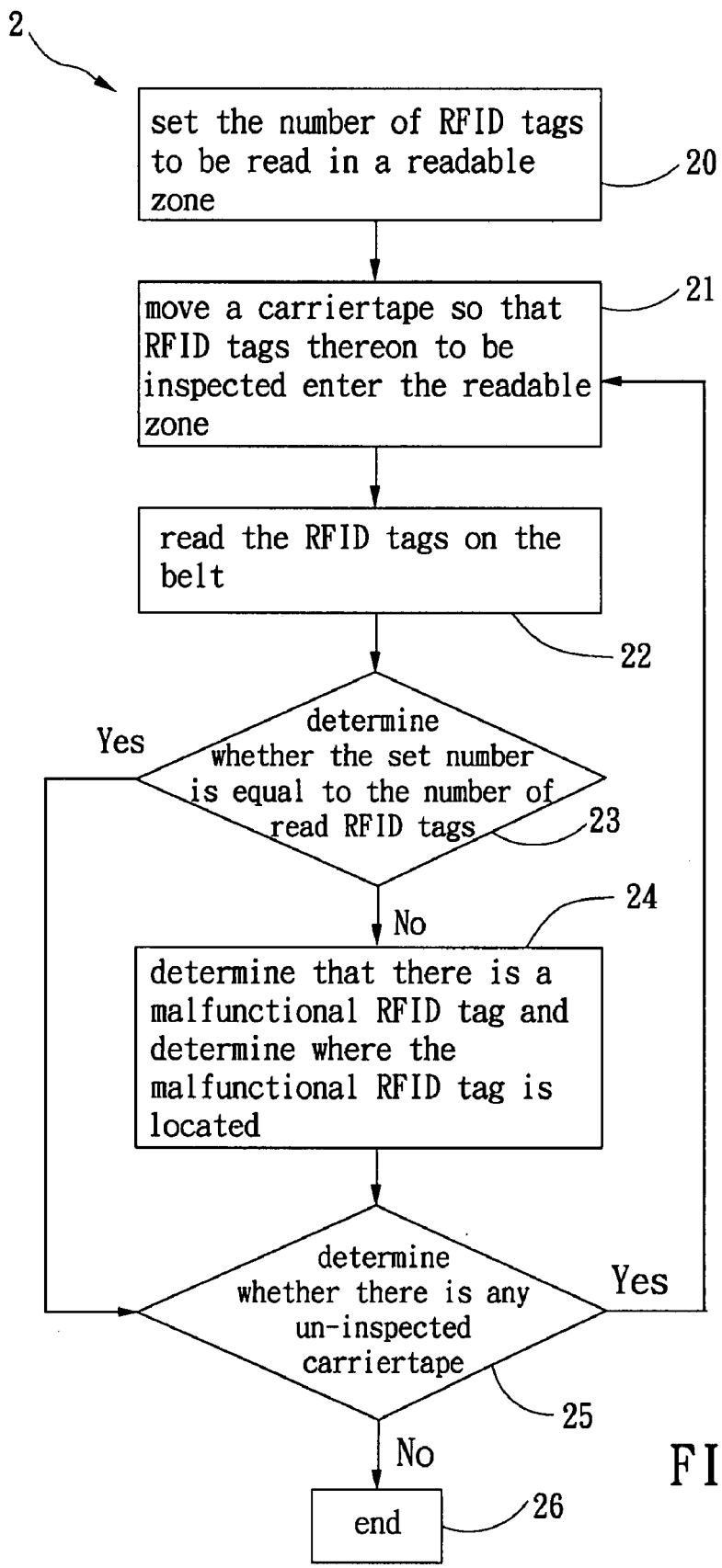
FIG. 2 is a flow-chart showing the method for inspecting RFID tags according to one embodiment of the present invention.

Please refer to FIG. 2, which is a flow-chart showing the method for inspecting RFID tags according to one embodiment of the present invention. The method comprises steps described hereinafter.

First, in Step 20, the number of RFID tags to be read in a readable zone is set. Then in Step 21, a carriertape is moved so that RFID tags thereon to be inspected enter the readable zone. In Step 22, the RFID tags on the carriertape are read. In Step 23, whether the set number (from Step 20) is equal to the number of read RFID tags (from Step 22) is determined. If the set number (from Step 20) is equal to the number of read RFID tags (from Step 22), all the RFID tags in the readable zone are functional and the process goes to Step 25; otherwise, it is determined that there is a malfunctional RFID tag if the set number (from Step 20) is different from the number of read RFID tags (from Step 22) by at least two. Therefore, the process goes to Step 24 to determine where the malfunctional RFID tag is located. Then in Step 25, whether there is any un-inspected carriertape is determined. The process ends if there is no more un-inspected carriertape; otherwise, the process goes to Step 21 and repeats until all the RFID tags have been inspected.

Figure 3:
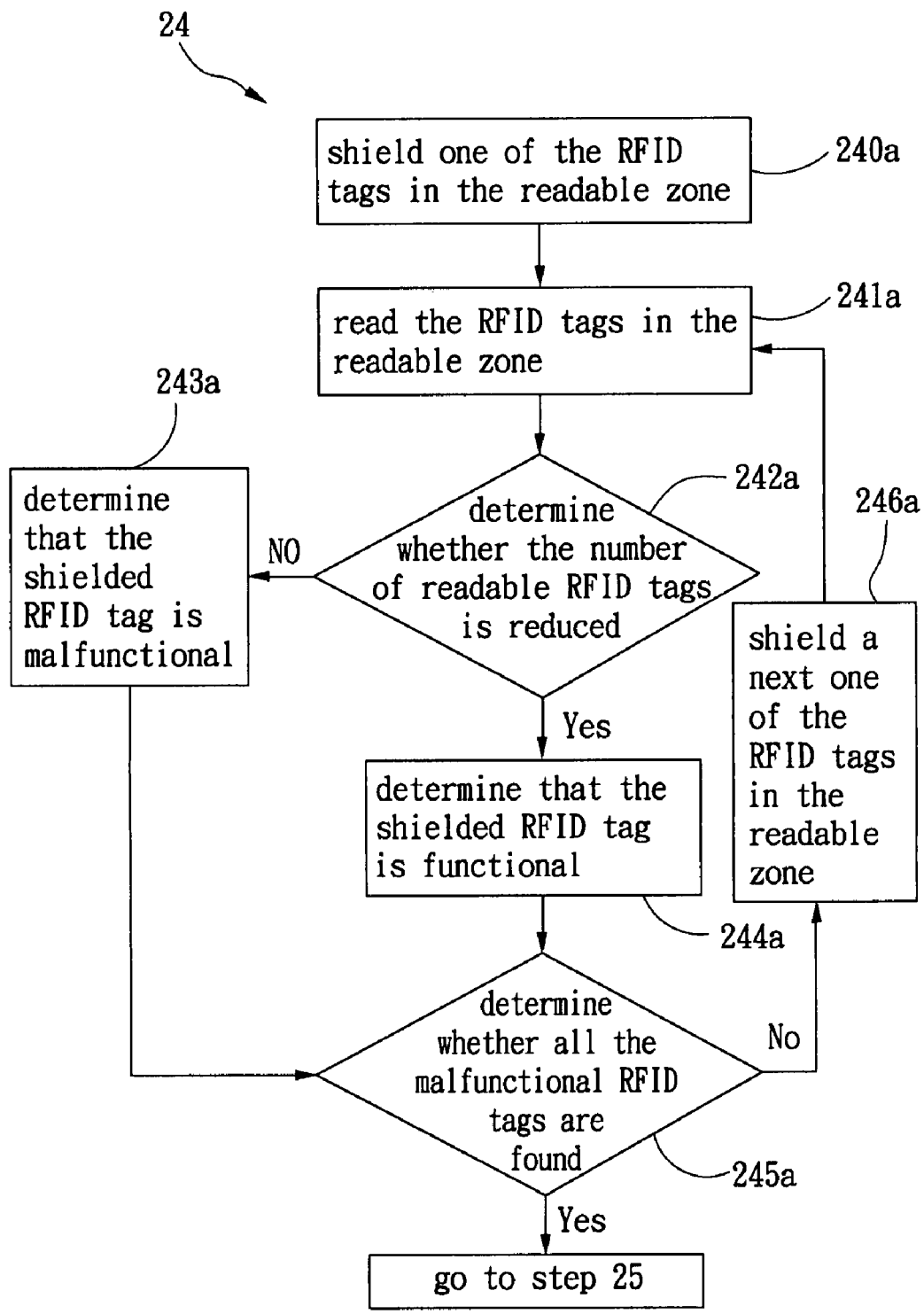
FIG. 3 is a flow-chart showing the step of determining whether there is any malfunctional RFID tag of the method for inspecting RFID tags according to a first embodiment of the present invention.

Please refer to FIG. 3, which is a flow-chart showing the step of determining whether there is any malfunctional RFID tag of the method for inspecting RFID tags according to a first embodiment of the present invention. In the present embodiment, the RFID tags are shielded in a one-by-one manner to determine whether the RFID tags are functional or not. In Step 24, the process starts with Step 240a, in which one of the RFID tags in the readable zone is shielded. Then in Step 241a, the RFID tags in the readable zone are read. Afterwards, the Step 242a is performed to determine whether the number of readable RFID tags is reduced. The process goes to Step 243a if the number of readable RFID tags is not reduced. In Step 243a, it is determined and recorded that the shielded RFID tag is malfunctional. Otherwise, if the number of readable RFID tags is reduced, the process goes to Step 244a to determine that the shielded RFID tag is functional. Afterwards, in Step 245a, it is determined whether all the malfunctional RFID tags are found. The process goes to Step 25 if all the malfunctional RFID tags are found; otherwise, the process goes to Step 246a to shield a next one of the RFID tags in the readable zone. Then the process returns to Step 241a and repeats from Step 241a to 245a until all the malfunctional RFID tags are found.

Figure 4A:
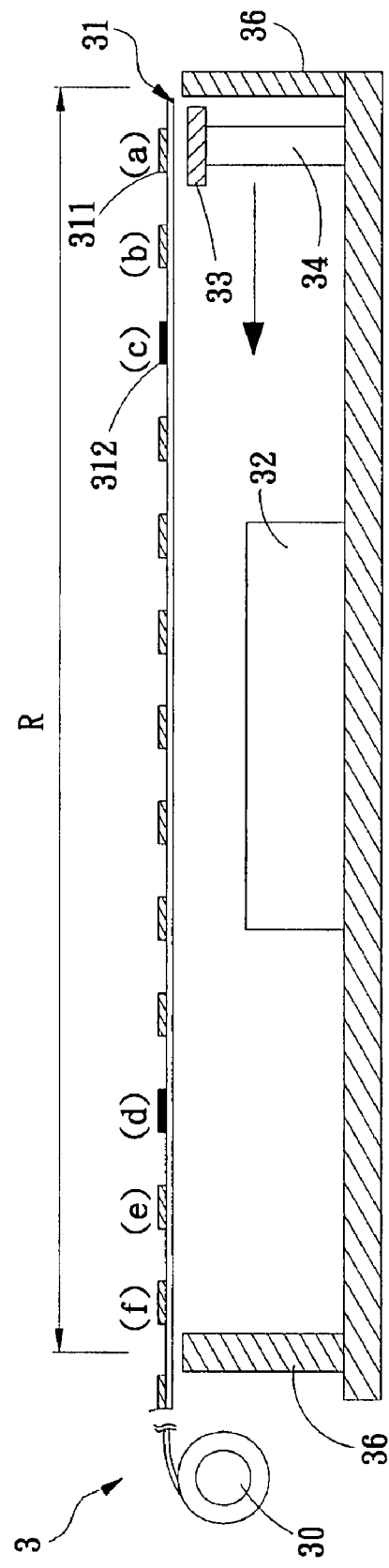
FIG. 4A, FIG. 4B and FIG. 4C are schematic diagrams of an apparatus for inspecting RFID tags according to a first embodiment of the present invention.
Figure 4B:
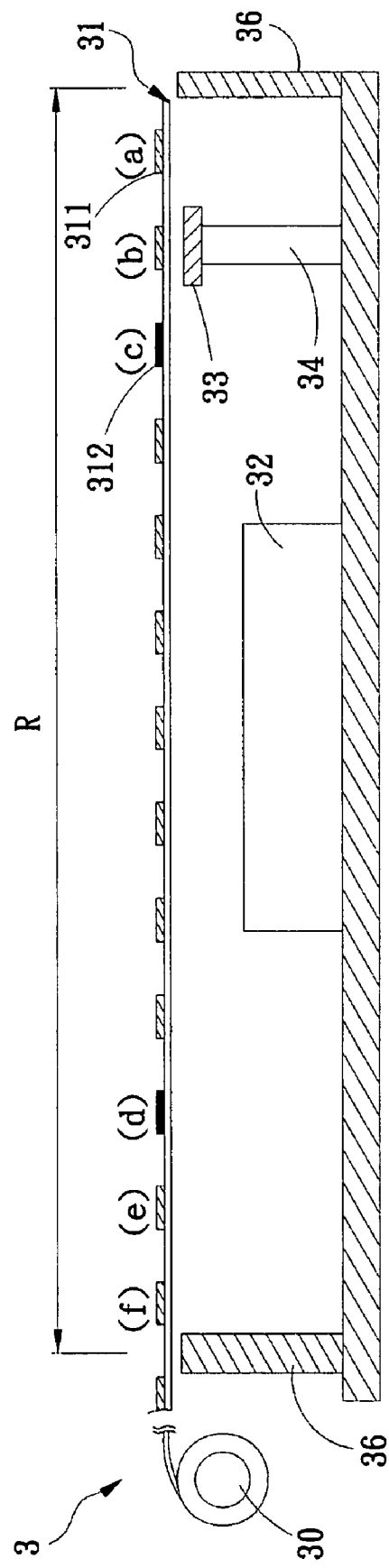
Figure 4C:
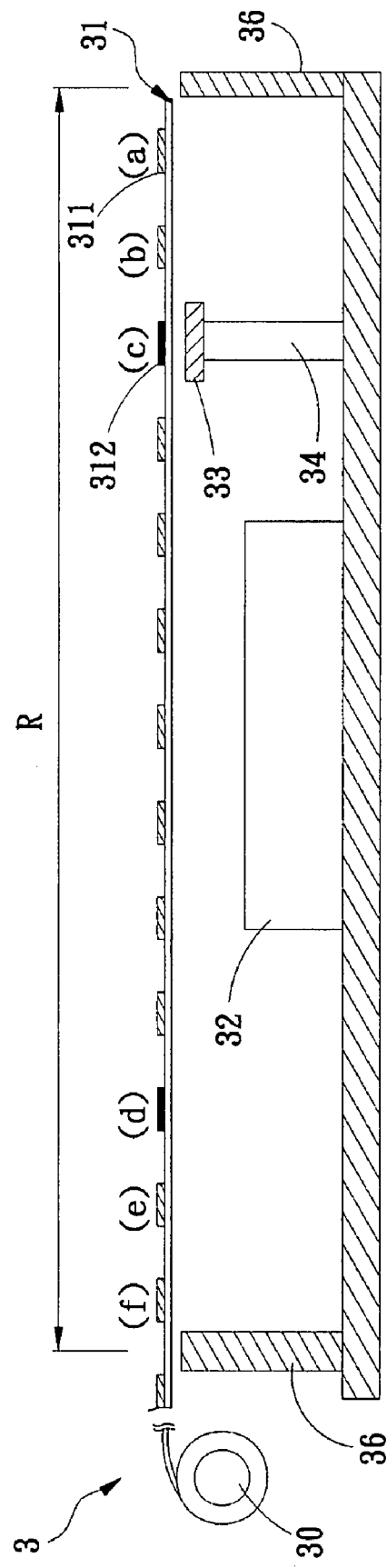

Please refer to FIG. 4A to FIG. 4C, which are schematic diagrams of an apparatus for inspecting RFID tags according to a first embodiment of the present invention. The apparatus 3 comprises a carriertape transportation device 30, a reading device 32, a shelter 33 and a moving device 34. The carriertape transportation device 30 is capable of carrying a carriertape 31 carrying a plurality of RFID tags 311. The RFID tags 311 can be active smart tags or passive smart tags. The carriertape transportation device 30 can be a roller to transport a reel carriertape, as shown in FIG. 4A. Alternatively, the carriertape transportation device 30 can be a holder plate to transport a sheet carriertape.

The reading device 32 is disposed on one side of the carriertape 31 and is capable of reading data in the RFID tags 311 on the carriertape 31 in a readable zone R. The shelter 33 is capable of shielding to limit the number of the RFID tags to be read by the reading device 32. In the present embodiment, the shelter 33 is formed of a metal material, a wave-breaking material, a wave-absorbing material, a wave-reflecting material or a wave-blocking material and is not limited thereto. In the present embodiment, the shelter 33 comprises a container to fill in with water for wave absorbing. Alternatively, the wave-absorbing material is a composite material or a polymeric material. The moving device 34 is connected to the shelter 33 and is capable of moving the shelter 33. In one embodiment, a shielding plate 36 is disposed on each of two sides of the reading device 32 to limit the readable zone to avoid the reading device from reading the RFID tags outside the readable zone R.

In the present embodiment accompanied by FIG. 3 and FIG. 4A, there are two malfunctional RFID tags 312 out of 13 RFID tags 311. Therefore, in the beginning, the reading device reads 11 RFID tags. When Step 240a is performed, the moving device 34 moves the shelter 33 to a proper position (a) to shield a RFID tag 301 from communication with the reading device 32. When the reading device 32 issues a signal, the reading device 32 only reads 10 RFID tags because the RFID tag 301 is shielded by the shelter 33. In Step 242a, it is determined that the number of the 10 RFID tags is smaller than the 11 RFID tags by one. Therefore, it is determined that the RFID tag 311 at a position (a) is functional.

Afterwards, the moving device proceeds to a next position (b) and the steps in FIG. 3 are performed accompanied by FIG. 4B. In FIG. 4C, when the moving device 34 moves the shelter 33 to shield a RFID 312 at a position (c), the reading device 32 reads 11 RFID tags because the RFID 312 at the position (c) is malfunctional. Therefore, in Step 242a, it is determined that the RFID tag 312 at the position (c) is malfunctional. The steps are repeated until all the malfunctional RFID tags in the readable zone are found. In the present embodiment, another malfunctional RFID is located at a position (d). When the moving device 34 moves to the position (d), all the malfunctional RFID tags can be found. Therefore, even though the RFID tags at a position (e) and a position (f) are not inspected, the process can go to Step 26 for a next carriertape.

Figure 5A:
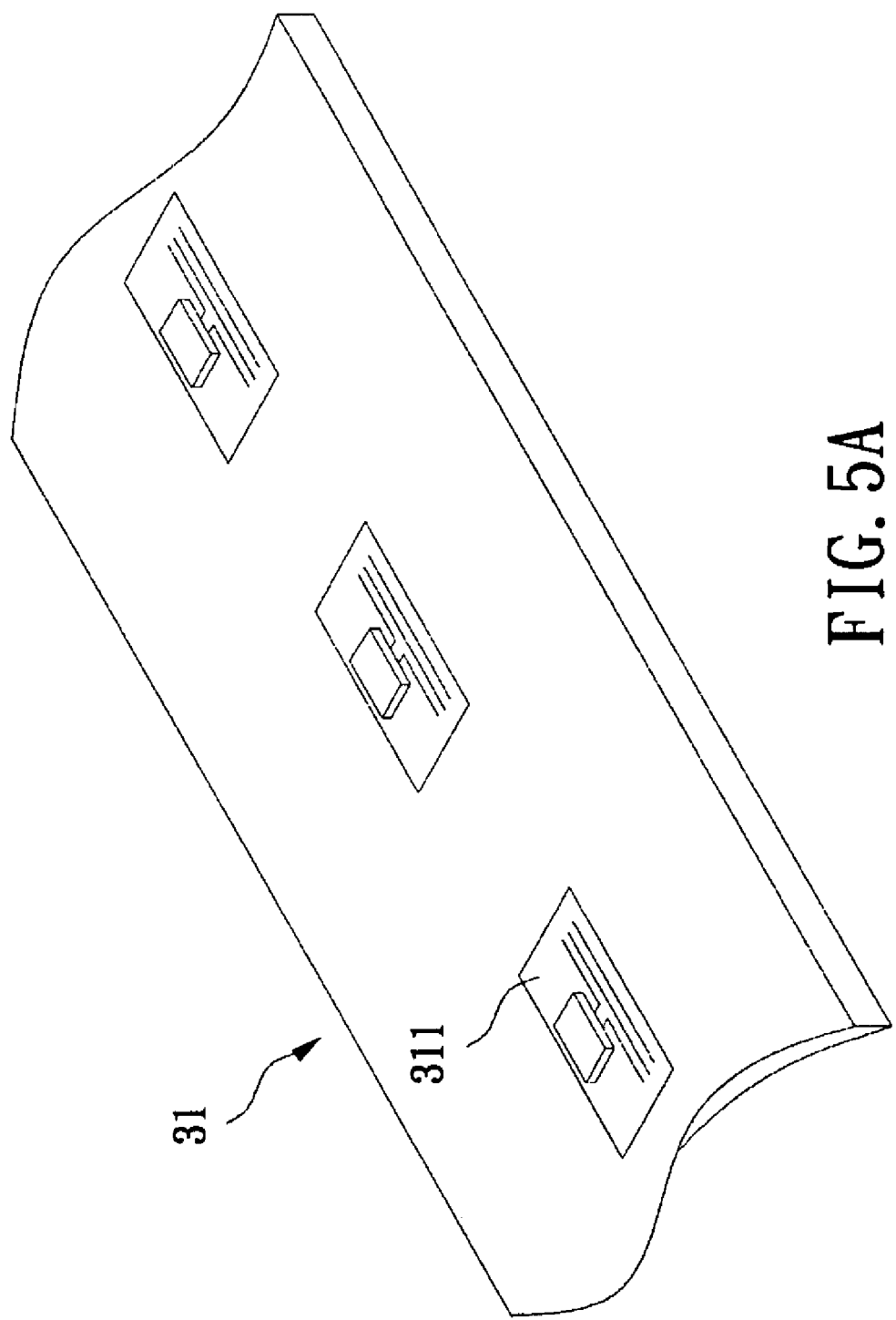
FIG. 5A, FIG. 5B and FIG. 5C are examples of an carriertape in an apparatus for inspecting RFID tags according to one embodiment of the present invention.
Figure 5B:
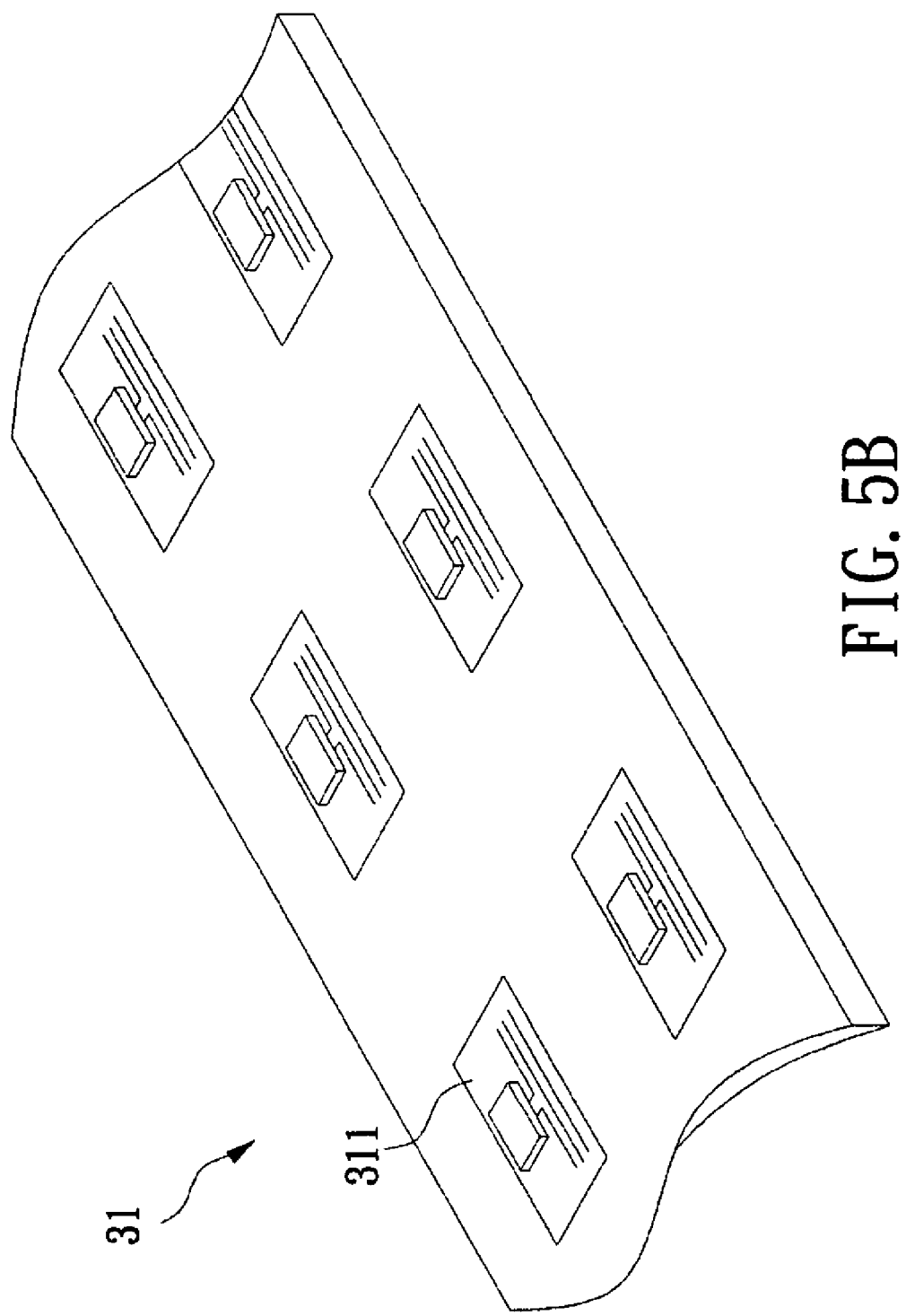
Figure 5C:
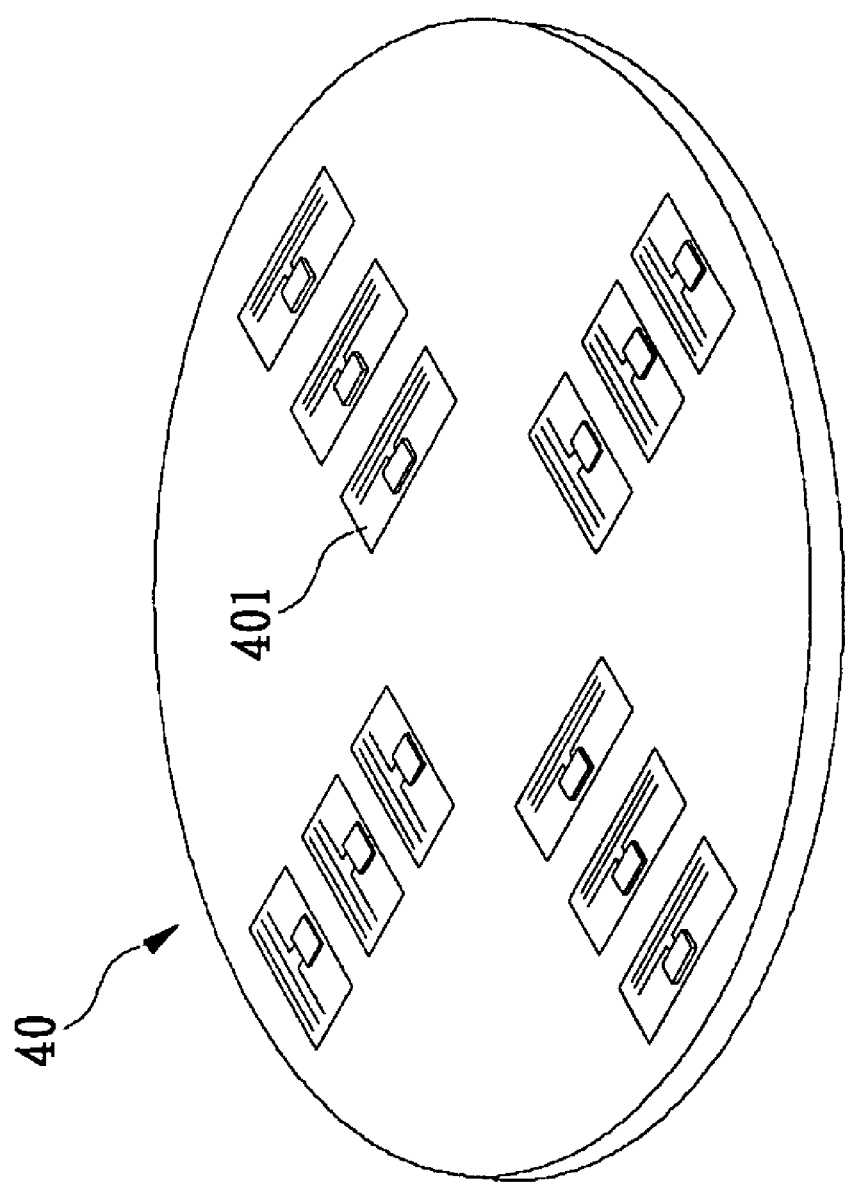

Please refer to FIGS. 5A, 5B and 5C, which are examples of a carriertape in an apparatus for inspecting RFID tags according to one embodiment of the present invention. In FIG. 5A and FIG. 5B, the carriertape 31 is a rectangular. The carriertape in FIG. 5A has a row of RFID tags 311, while the carriertape in FIG. 5B has a plurality of rows of RFID tags 311. In FIG. 5C, the carriertape is a disc carriertape and the RFID tags are arranged in at least one row on the disc carriertape. However, the present invention is not limited to the previous embodiments.

Figure 6A:
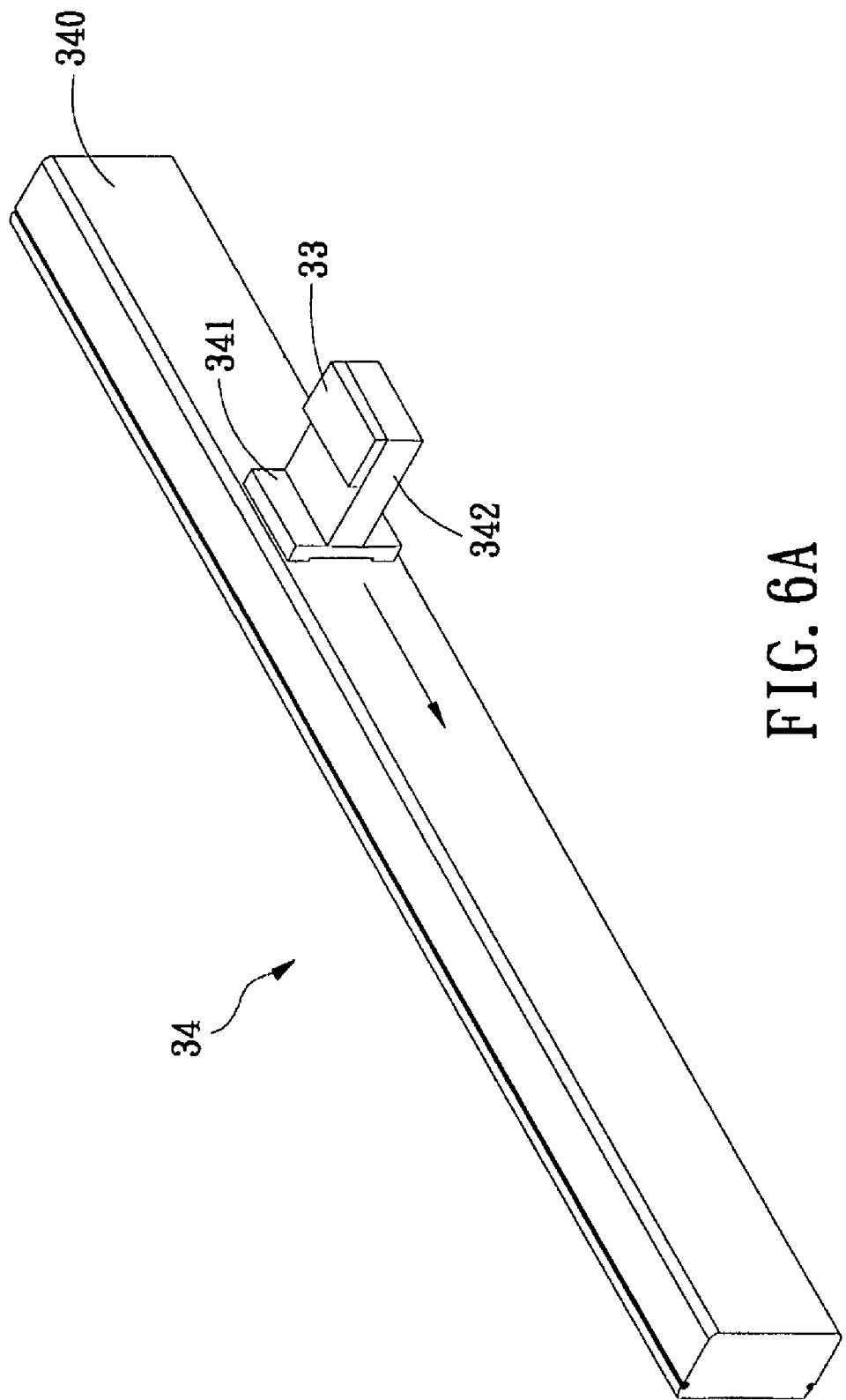
FIG. 6A is an example of a moving device in an apparatus for inspecting RFID tags according to one embodiment of the present invention.
Figure 6B:
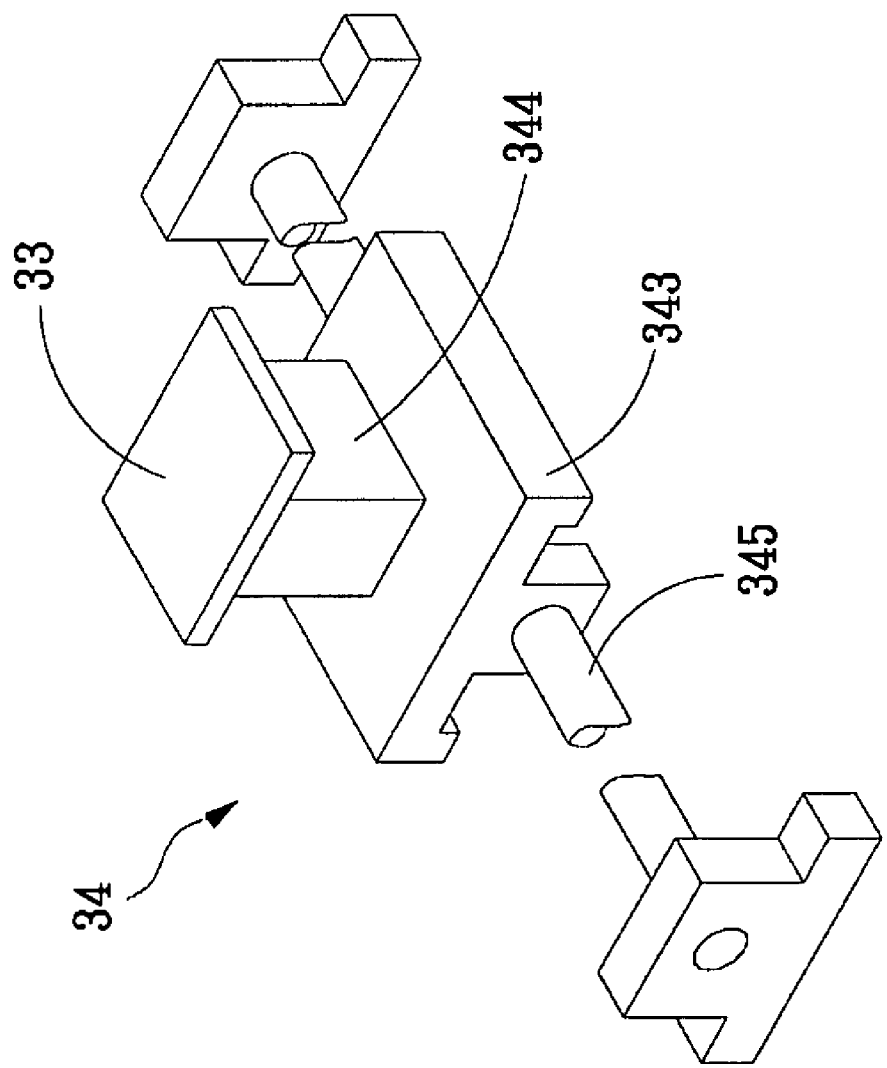
FIG. 6B is an example of a moving device in an apparatus for inspecting RFID tags according to another embodiment of the present invention.

Please refer to FIG. 6A, which is an example of a moving device 34 in an apparatus for inspecting RFID tags according to one embodiment of the present invention. In the present embodiment, the moving device 34 comprises a guiding rail 340 and a carrier 341 installed on the guiding rail 340. The carrier 341 comprises a holder 342 disposed thereon to carry the shelter 33 disposed thereon. The guiding rail 340 drives the carrier 341 to control the shelter 33 to move to a specific position to shield the RFID tags from communication with the reading device. Alternatively, the moving device can be driven by a screw bolt. Referring to FIG. 6B, which is an example of a moving device in an apparatus for inspecting RFID tags according to another embodiment of the present invention, the moving device 34 comprises a screw bolt 345 coupled to a carrier 343. The carrier 343 comprises a holder 344 disposed thereon to carry the shelter 33 disposed thereon. The screw bolt 345 drives the carrier 343 to move using a driving device (not shown) such as a motor to control the sheltering device 33 to move to a specific position to shield the RFID tag from communication with the reading device. The moving device 34 can be implemented using previous embodiments accompanied by FIG. 6A and FIG. 6B but is not limited thereto.

Figure 7:
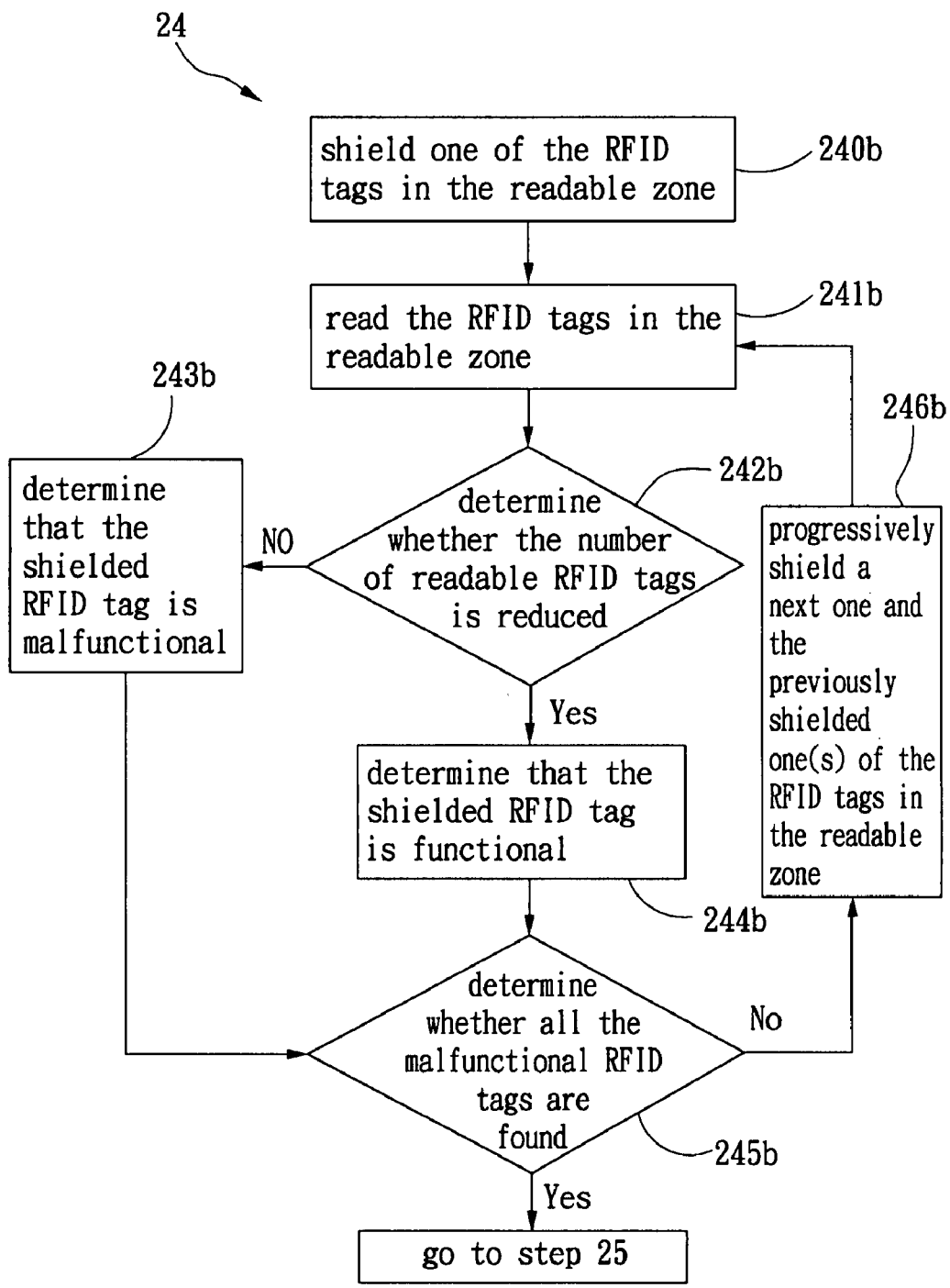
FIG. 7 is a flow-chart showing the step of determining whether there is any malfunctional RFID tag of the method for inspecting RFID tags according to a second embodiment of the present invention.

Please refer to FIG. 7, which is a flow-chart showing the step of determining whether there is any malfunctional RFID tag of the method for inspecting RFID tags according to a second embodiment of the present invention. The present embodiment is different from the embodiment accompanied by FIG. 3 wherein the RFID tags are shielded in a one-by-one manner. In the present embodiment, the RFID tags are shielded progressively. First, in Step 240b, one of the RFID tags in the readable zone is shielded. Then in Step 241b, the RFID tags in the readable zone are read. Afterwards, the Step 242b is performed to determine whether the number of readable RFID tags is reduced. The process goes to Step 243b if the number of readable RFID tags is not reduced. In Step 243b, it is determined and recorded that the shielded RFID tag is malfunctional. Otherwise, if the number of readable RFID tags is reduced, the process goes to Step 244b to determine that the shielded RFID tag is functional. Afterwards, in Step 245b, it is determined whether all the malfunctional RFID tags are found. The process goes to Step 25 if all the malfunctional RFID tags are found; otherwise, the process goes to Step 246b to progressively shield a next one and the previously shielded one(s) of the RFID tags in the readable zone. Then the process returns to Step 241b and repeats from Step 241b to 245b until all the malfunctional RFID tags are found. It is noted that, unlike the first embodiment wherein only one RFID tag is shielded, in the present embodiment, all the previously shielded RFID tags are also shielded. Therefore, in Step 242b, whether the number of readable RFID tags is reduced is determined according to the number of read RFID tags after some RFID tags are progressively shielded, instead of the number of read RFID tags in Step 22 in FIG. 2.

Figure 8A:
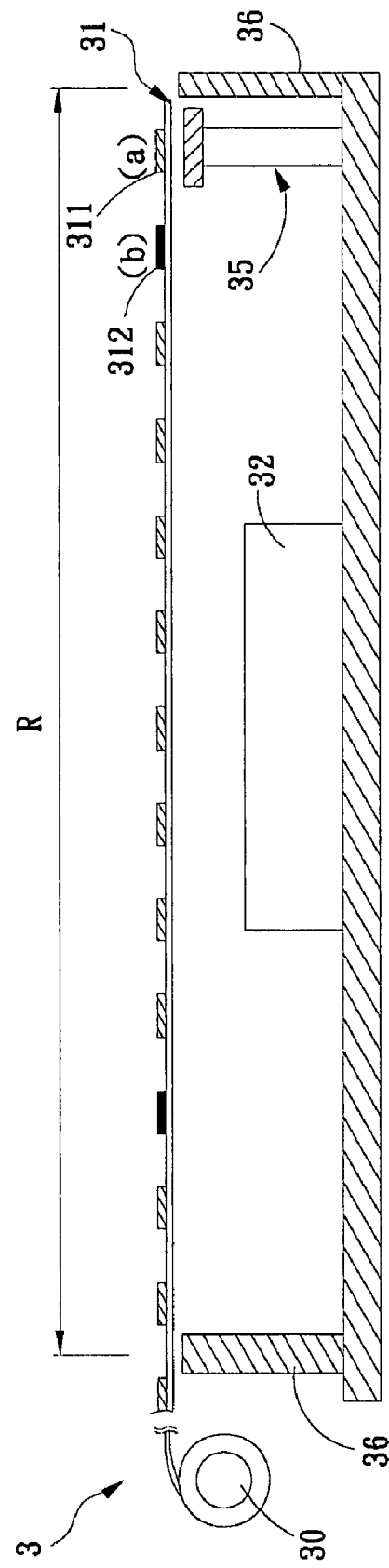
FIG. 8A and FIG. 8B are schematic diagrams of an apparatus for inspecting RFID tags according to a second embodiment of the present invention.
Figure 8B:
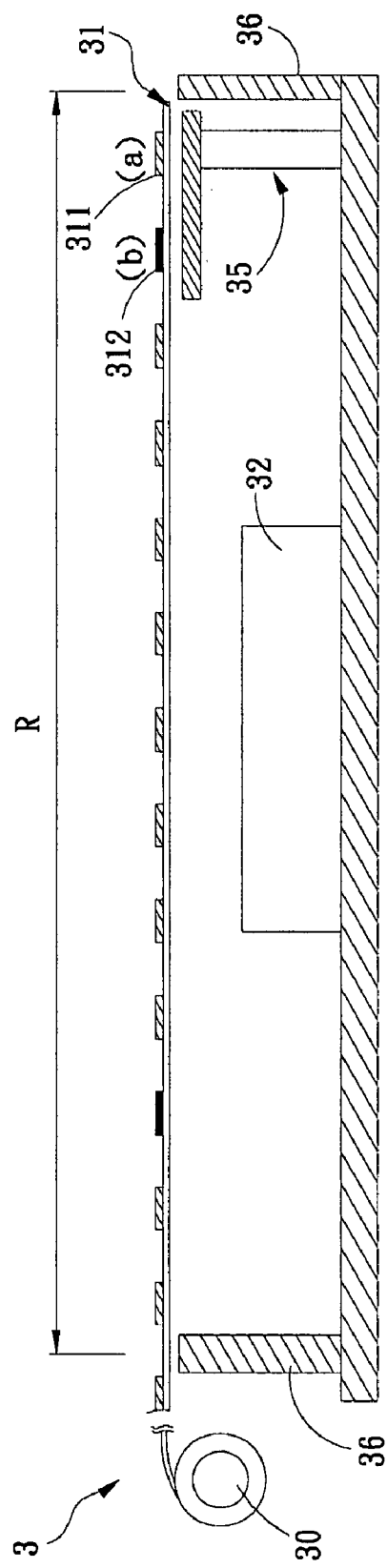

Please refer to FIG. 8A and FIG. 8B for schematic diagrams of an apparatus for inspecting RFID tags according to a second embodiment of the present invention. The apparatus 3 can be used to implement the method accompanied by FIG. 7. The apparatus 3 comprises a carriertape transportation device 30, a reading device 32 and a sheltering device 35. The carriertape transportation device 30 is capable of carrying a carriertape 31. The carriertape 31 carries a plurality of RFID tags 311. The carriertape transportation device 30 and the carriertape 31 are similar to those as previously described, and thus, descriptions thereof are not repeated. The reading device 32 is disposed on one side of the carriertape 31 and is capable of reading data in the RFID tags 311 on the carriertape 31 in a readable zone R. In one embodiment, a shielding plate 36 is disposed on each of two sides of the reading device 32 to limit the readable zone to avoid the reading device from reading the RFID tags outside the readable zone R. The sheltering device 35 is capable of shielding to limit the number of the RFID tags to be read by the reading device 35 and the sheltering device 35 is capable of varying a shielding area to determine the number of RFID tags.

Hereinafter, the step of progressively shielding RFID tags in FIG. 7 is described accompanied by FIG. 8A. In the beginning, the sheltering device 35 shields a single RFID tag. Since there are still undetermined malfunctional RFID tags after Step 245b is performed, the process goes to Step 246b to progressively shield two RFID tags, as described in FIG. 8B. Then, the process goes back to Step 241b so that the reading device 32 reads the RFID tags in the readable zone R.

Then, it is determined whether the number of readable RFID tags is reduced compared to the number of the RFID tags when one RFID tag is shielded. If the number of readable RFID tags is reduced, it is determined that the newly shielded RFID tag is functional; otherwise, it is determined that the newly shielded RFID tag is malfunctional. Referring to FIG. 8A and FIG. 8B, for example in FIG. 8A, the number of read RFID tags is 10, which means that the RFID tag at the position (a) is functional. In FIG. 8B, the number of read RFID tags is 10, which means that the newly shielded RFID tag at the position (b) is malfunctional.

Figure 9A:
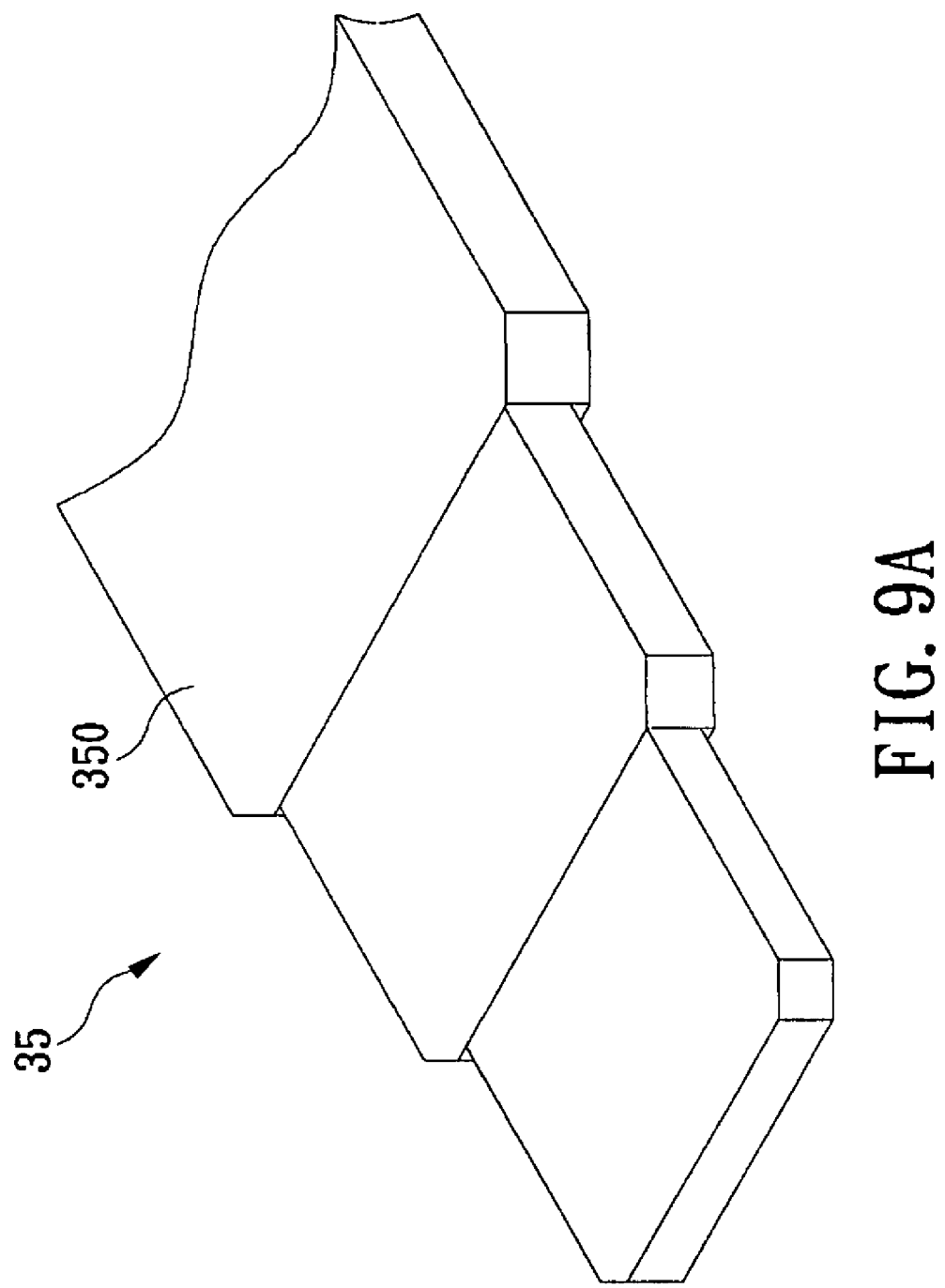
FIG. 9A and FIG. 9B are examples of a sheltering device in an apparatus for inspecting RFID tags according to a second embodiment of the present invention.
Figure 9B:
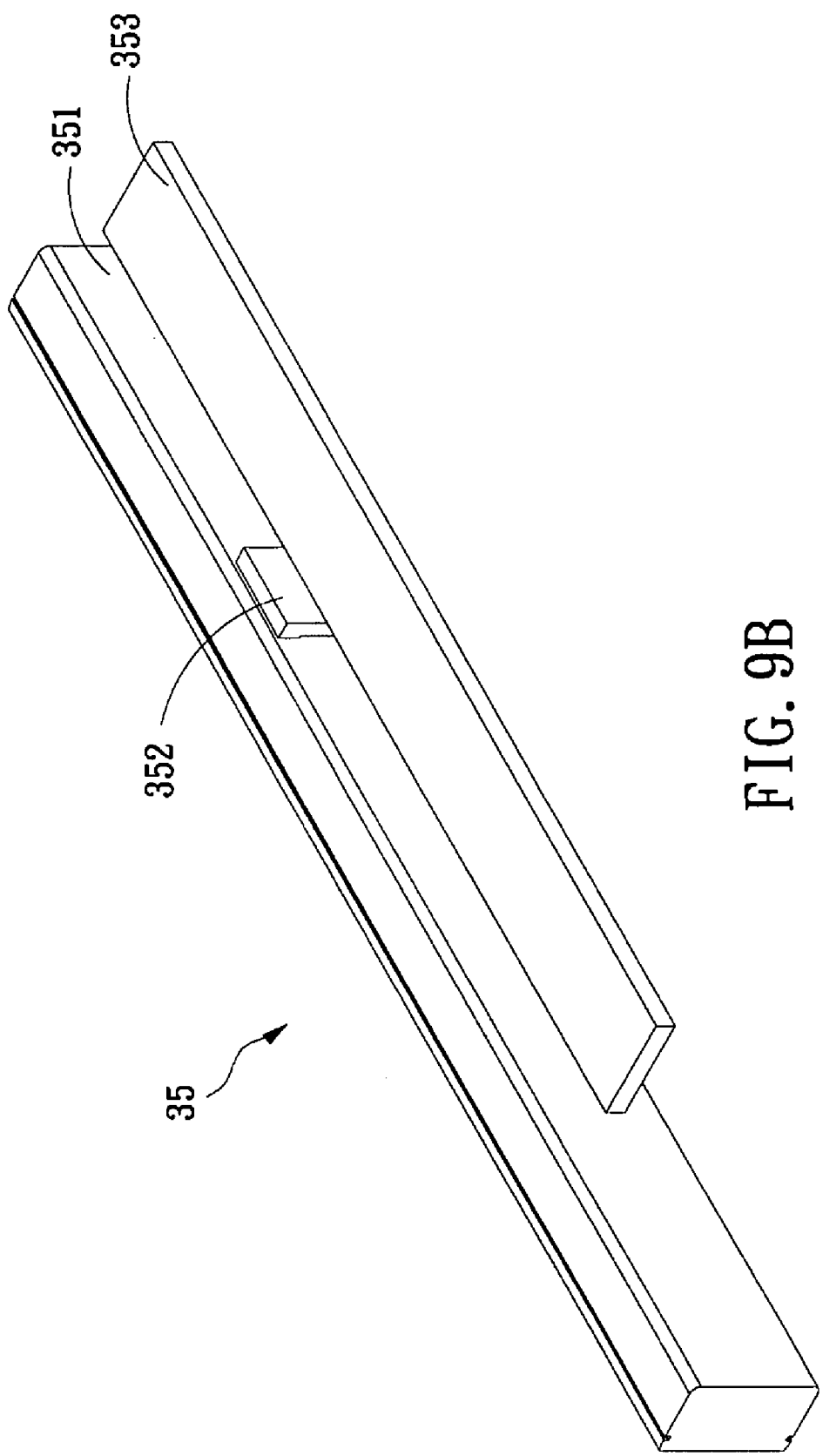

The sheltering device 35 capable of progressively shielding in FIG. 8A is implemented, as shown in FIG. 9A, to comprise a plurality of shelters 350 capable of stretching to enlarge the shielding area so that the sheltering device controls the number of stretched shelters. In addition to FIG. 9A, the sheltering device 35 can also be implemented, as shown in FIG. 9B, to comprise a driving device comprising a linear guiding rail 351 and a carrier 352 installed on the linear guiding rail 351. A large shelter 353 is disposed on the carrier 352 to be driven by the linear guiding rail 351 to move towards the readable zone R to progressively shield a next one and the previously shielded one(s) of the RFID tags by a linear movement.

Figure 10A:
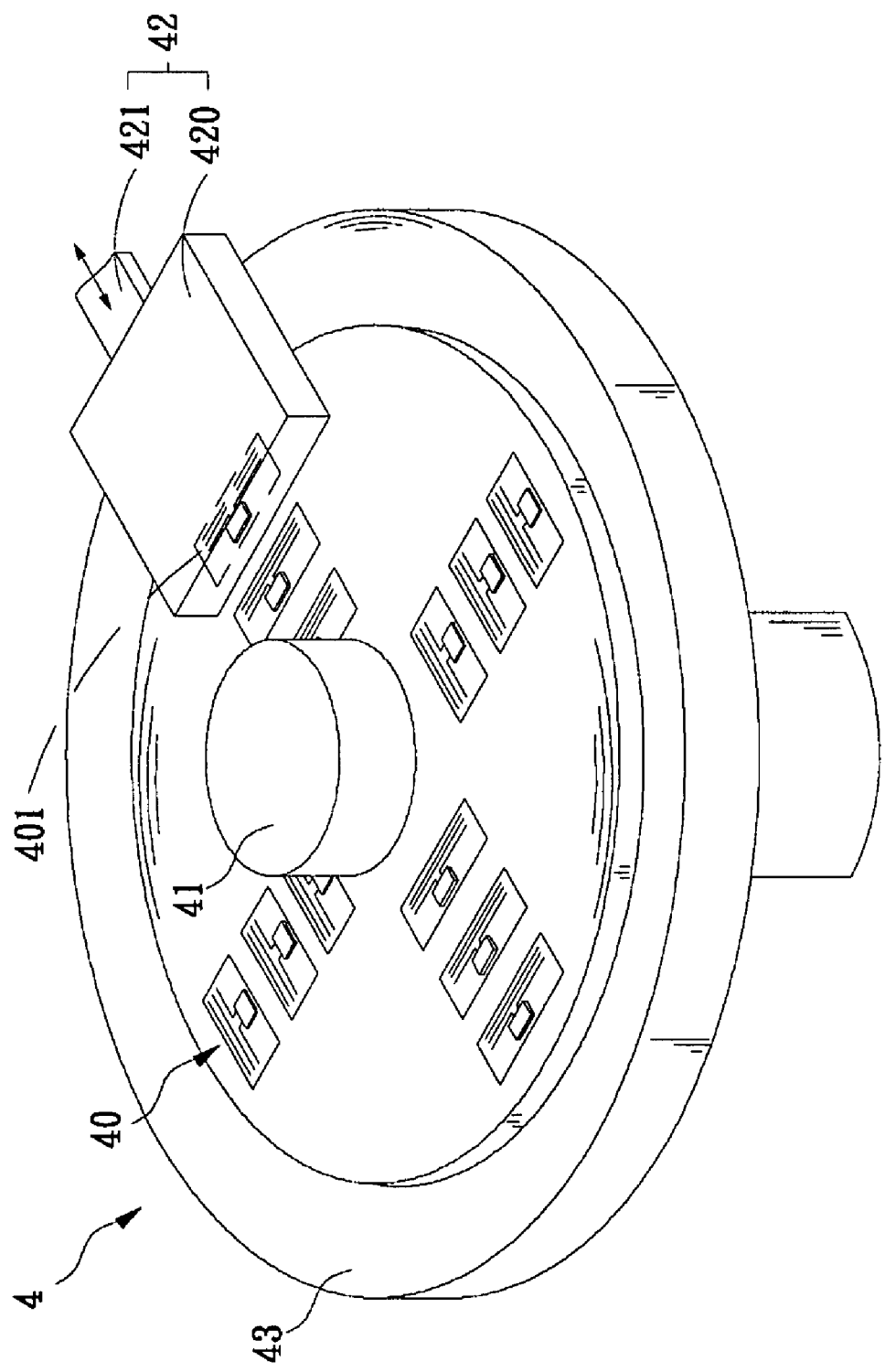
FIG. 10A and FIG. 10B are schematic diagrams of an apparatus for inspecting RFID tags according to a third embodiment of the present invention.
Figure 10B:
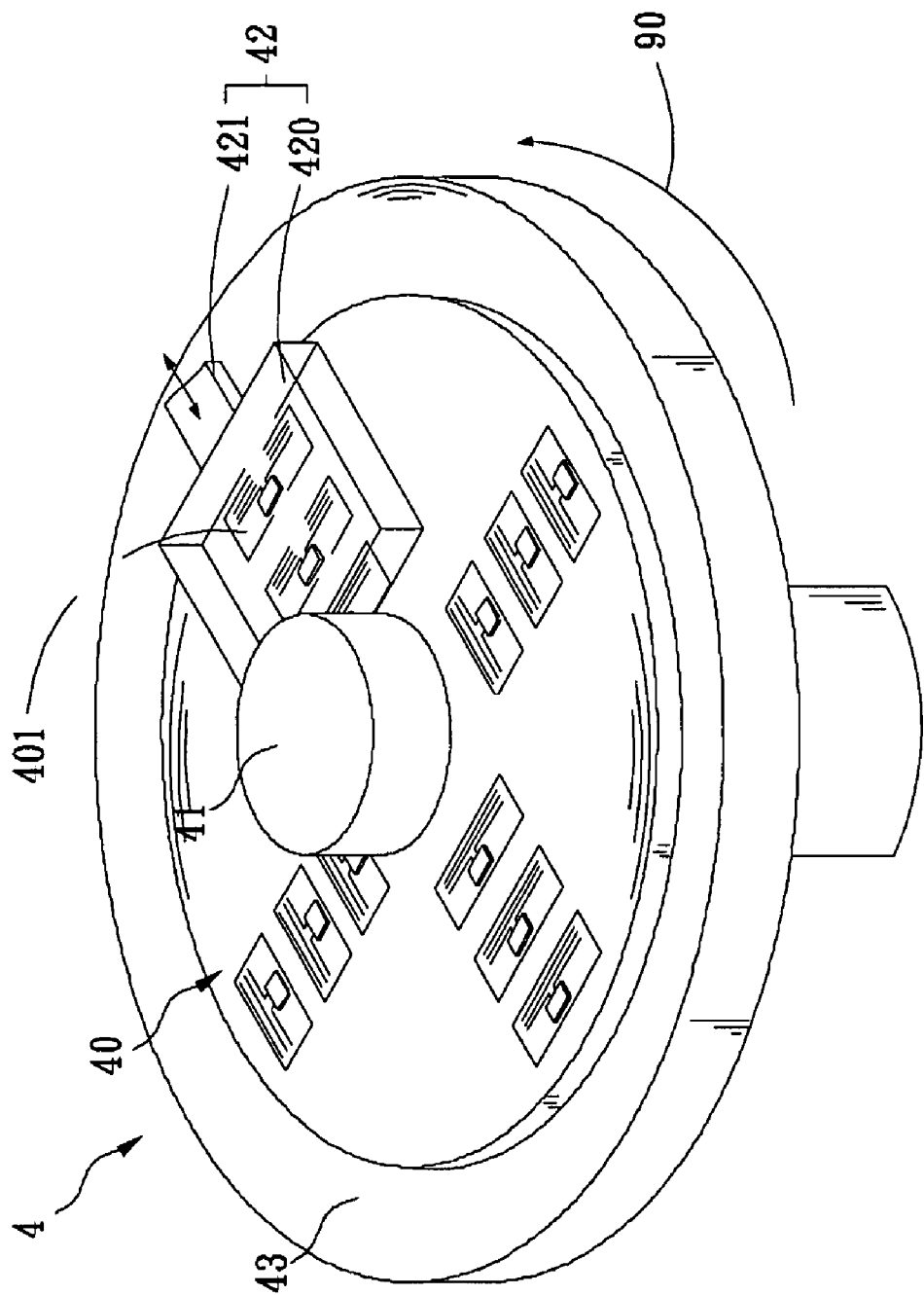

Please refer to FIG. 10A and FIG. 10B, which are schematic diagrams of an apparatus for inspecting RFID tags according to a third embodiment of the present invention. In the present embodiment, the apparatus 4 comprises a carriertape transportation device 43, a reading device 41 and a sheltering device 42. The carriertape transportation device 43 is capable of performing a rotating movement 90 and carrying a disc carriertape 40 carrying a plurality of RFID tags 401.

The reading device 41 is disposed on one side of the disc carriertape 40. The sheltering device 42 comprises a shelter 420 and a driving device 421. The driving device 421 is capable of controlling the shelter 420 to move back and forth to shield the RFID tags 401 from communication with the reading device 41.

Basically, the operation of the apparatus 4 in the present embodiment is similar to that of the previously described two embodiments. In FIG. 10B, however, since the carriertape 40 is disc-shaped, it is required that the carriertape transportation device 43 performs a rotating movement 90 to move a next un-inspected region to a position corresponding to the sheltering device 42 for inspection until all the malfunctional RFID tags are found after the sheltering device 42 has shielded a batch of three RFID tags.

Figure 1A:
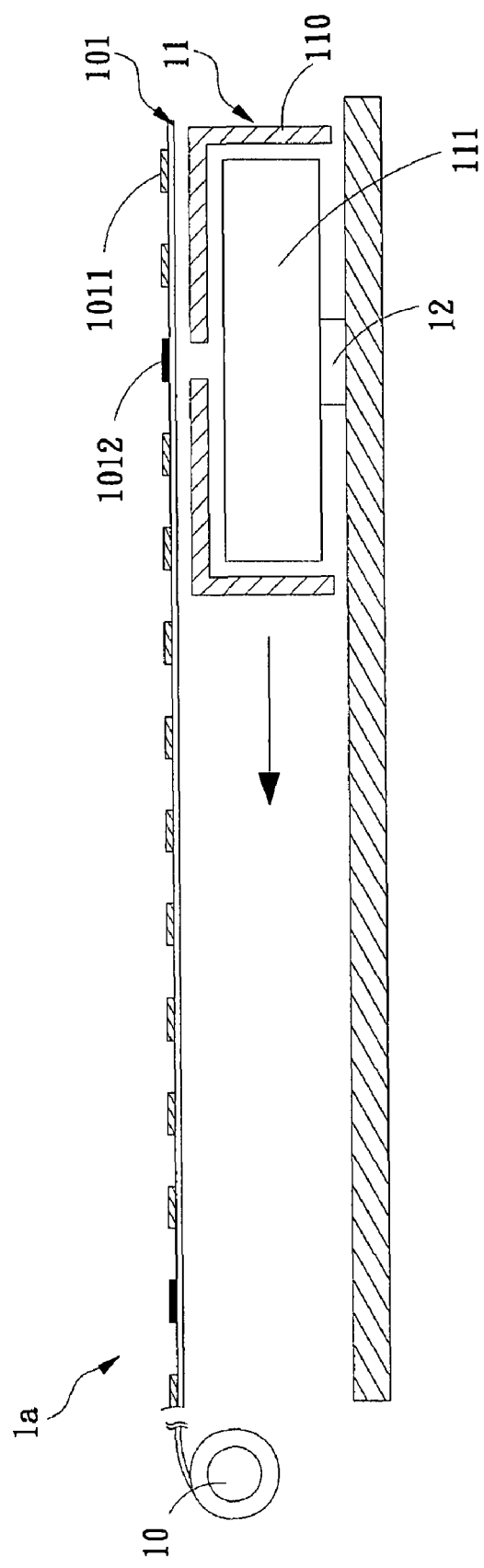
FIG. 1A and FIG. 1B are two examples of conventional apparatuses for inspecting RFID tags.
Figure 1B:
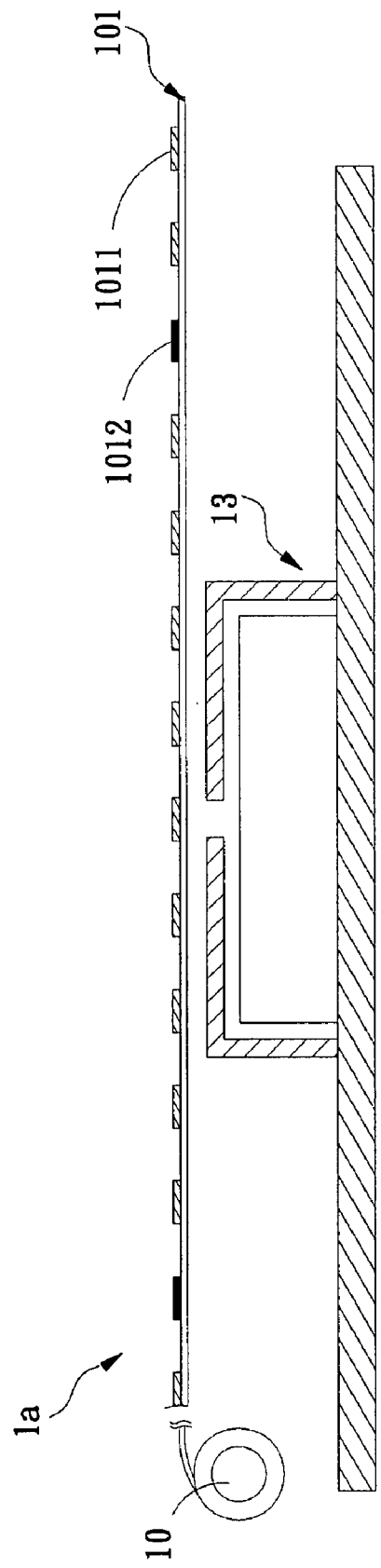
Figure 11A:
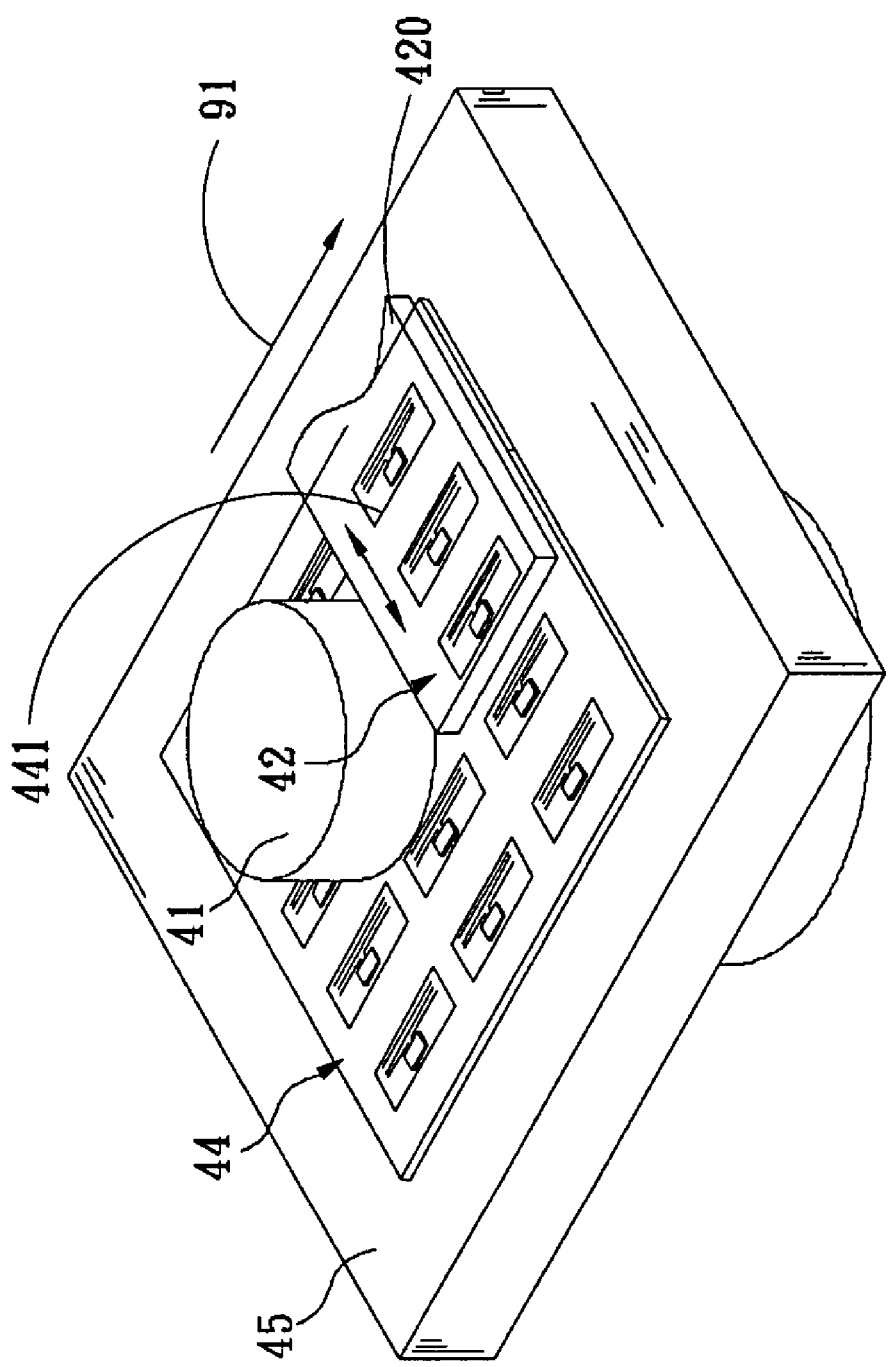
FIG. 11A and FIG. 11B are schematic diagrams of an apparatus for inspecting RFID tags according to a fourth embodiment of the present invention.
Figure 11B:
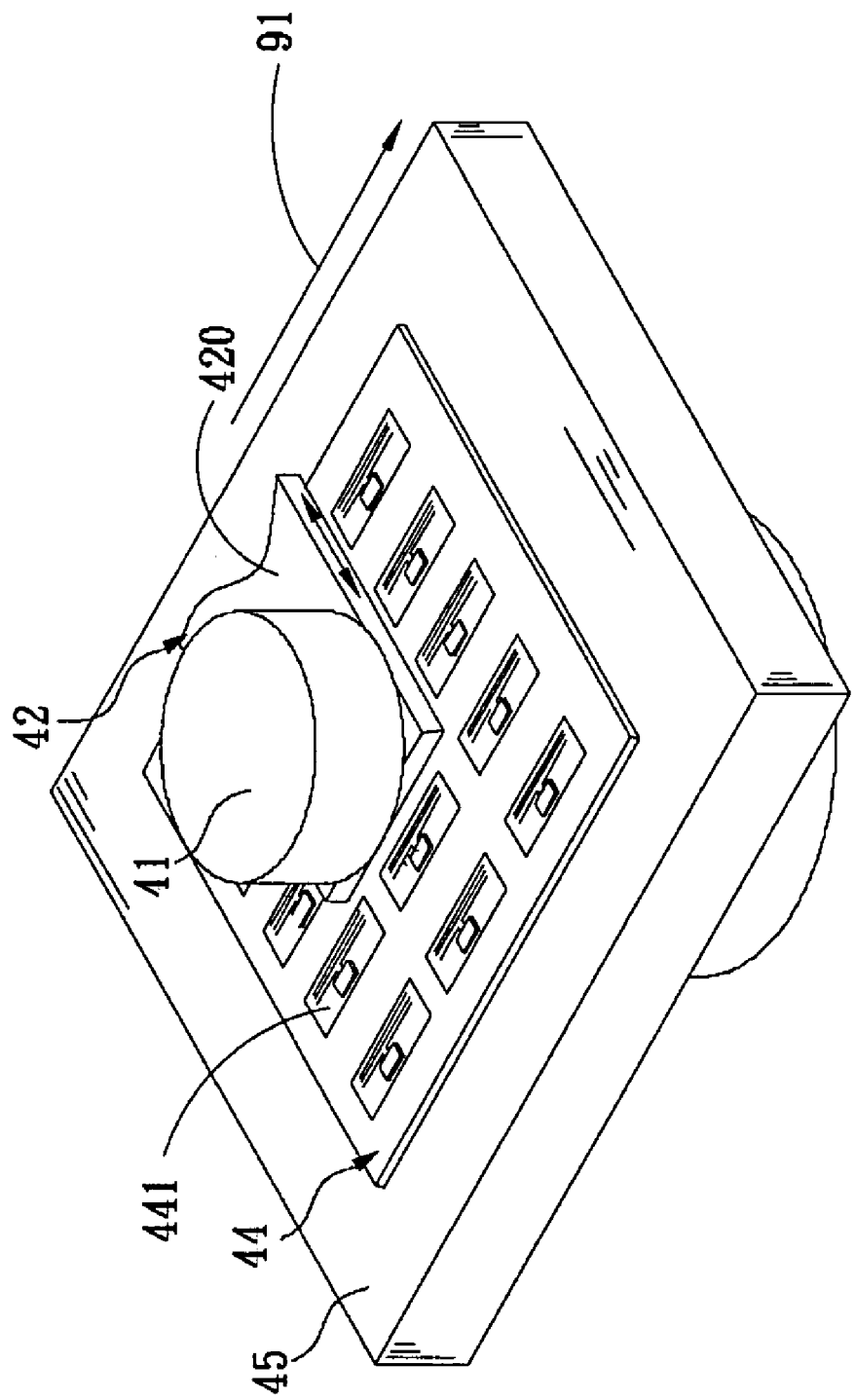

Please refer to FIG. 11A and FIG. 11B, which are schematic diagrams of an apparatus for inspecting RFID tags according to a fourth embodiment of the present invention. In FIG. 11A, a rectangular carriertape 44 is disposed on a carriertape transportation device 45. The rectangular carriertape 44 carries a plurality of RFID tags 441. The operation of the sheltering device 42 is similar to that of the previous embodiment in FIG. 10A. Since the carriertape 44 is rectangular-shaped, it is required that the carriertape transportation device 45 performs a linear movement 91 to move a next un-inspected region to a position corresponding to the sheltering device 42 (as shown in FIG. 1B) for inspection until all the malfunctional RFID tags are found after the sheltering device 42 has shielded five RFID tags in a first row.

According to the above discussion, it is apparent that the present invention discloses a method and an apparatus for inspecting radio frequency identification (RFID) tags by determining whether there is any malfunctional RFID tag and then determining where the malfunctional RFID tag is located using a way of shielding. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for inspecting radio frequency identification (RFID) tags, comprising steps of:
   (a) reading a plurality of RFID tags in a readable zone; and
   (b) determining whether there is any malfunctional RFID tag in the plurality of RFID tags, and determining where the malfunctional RFID tag is located using a way of shielding if there is any malfunctional RFID tag;
   wherein the way of shielding further comprises steps of:
   (b1) shielding one of the RFID to s in the readable zone;
   (b2) reading the RFID tags in the readable zone and determining whether the number of readable RFID tags in the readable zone is reduced;
   (b3) determining that the shielded RFID to is functional if the number of readable RFID tags in the readable zone is reduced and determining that the shielded RFID tag is malfunctional if the number of readable RFID tags in the readable zone is not reduced; and
   (b4) shielding a next one of the RFID tags and going to step (b2) until all the malfunctional RFID tags are found.

2. The method for inspecting RFID tags as recited in claim 1, wherein the step of determining whether there is any malfunctional RFID tag is implemented by examining whether the number of read RFID tags is equal to the number of the RFID tags.

3. A method for inspecting radio frequency identification (RFID) tags, comprising steps of:
   (a) reading a plurality of RFID tags in a readable zone: and
   (b) determining whether there is any malfunctional RFID tag in the plurality of RFID tags, and determining where the malfunctional RFID tag is located using a way of shielding if there is any malfunctional RFID tag;
   wherein the way of shielding further comprises steps of:
   (b1) shielding one of the RFID tags in the readable zone;
   (b2) reading the RFID tags in the readable zone and determining whether the number of readable RFID tags in the readable zone is reduced;
   (b3) determining that the shielded RFID tag is functional if the number of readable RFID tags in the readable zone is reduced and determining that the shielded RFID tag is malfunctional if the number of readable RFID tags in the readable zone is not reduced; and
   (b4) progressively shielding a next one and the previously shielded one(s) of the RFID tags in the readable zone and going to step (b2) until all the malfunctional RFID tags are found.

4. An apparatus for inspecting radio frequency identification (RFID) tags, comprising:
   a carriertape transportation device, carrying a carriertape carrying a plurality of RFID tags;
   a reading device, disposed on one side of the carriertape and reading data in the RFID tags on the carriertape in a readable zone, wherein a shielding plate is disposed on each of the two sides of the reading device and a readable zone is formed between the shielding plates;
   a shelter, shielding selective RFID tags to limit the number of the RFID tags to be read by the reading device, wherein the process of shielding further comprises the steps of:
   shielding one of the RFID tags in the readable zone;
   reading the RFID tags in the readable zone and determining whether the number of readable RFID tags in the readable zone is reduced;
   determining that the shielded RFID tag is functional if the number of readable RFID tags in the readable zone is reduced and determining that the shielded RFID tag is malfunctional if the number of readable RFID tags in the readable zone is not reduced; and
   shielding a next one of the RFID tags and going to step (b2) until all the malfunctional RFID tags are found; and
   a moving device, connected to the shelter and moving the shelter.

5. The apparatus for inspecting RFID tags as recited in claim 4, wherein the carriertape is a disc carriertape.

6. The apparatus for inspecting RFID tags as recited in claim 5, wherein the RFID tags are arranged in at least one row on the disc carriertape.

7. The apparatus for inspecting RFID tags as recited in claim 6, wherein the carriertape is a rectangular carriertape.

8. The apparatus for inspecting RFID tags as recited in claim 7, wherein the RFID tags are arranged in at least one row on the rectangular carriertape.

9. The apparatus for inspecting RFID tags as recited in claim 4, wherein the shelter is formed of a metal material, a wave-breaking material, a wave-absorbing material, a wave-reflecting material or a wave-blocking material.

10. The apparatus for inspecting RFID tags as recited in claim 9, wherein the wave-absorbing material is water, a composite material or a polymeric material.

11. The apparatus for inspecting RFID tags as recited in claim 4, wherein the RFID tags are smart tags.

12. The apparatus for inspecting RFID tags as recited in claim 4, wherein the moving device further comprises:
    a guiding rail; and
    a carrier, installed on the guiding rail and connected to the shelter so as to move on the guiding rail.

13. An apparatus for inspecting radio frequency identification (RFID) tags, comprising:
    a carriertape transportation device, carrying a carriertape carrying a plurality of RFID tags;

a reading device, disposed on one side of the carriertape and reading data in the RFID tags on the carriertape in a readable zone; and a sheltering device, shielding selective RFID tags to limit the number of the RFID tags to be read by the reading device and varying a shielding area to determine the number of RFID tags, further comprising:

a driving device, performing a linear movement; and a shelter, disposed on the driving device and progressively shielding a next one and the previously shielded one(s) of the RFID tags by the linear movement;

wherein the process of shielding further comprises the steps of:

shielding one of the RFID tags in the readable zone;

reading the RFID tags in the readable zone and determining whether the number of readable RFID tags in the readable zone is reduced;

determining that the shielded RFID tag is functional if the number of readable RFID tags in the readable zone is reduced and determining that the shielded RFID tag is malfunctional if the number of readable RFID tags in the readable zone is not reduced; and shielding a next one of the RFID tags and going to step (b2) until all the malfunctional RFID tags are found.

14. The apparatus for inspecting RFID tags as recited in claim 13, wherein the carriertape is a rectangular carriertape.

15. The apparatus for inspecting RFID tags as recited in claim 14, wherein the RFID tags are arranged in at least one row on the rectangular carriertape.

16. The apparatus for inspecting RFID tags as recited in claim 13, wherein the shelter is formed of a metal material, a wave-breaking material, a wave-reflecting material, or a wave-blocking material.

\* \* \* \* \*